(12) United States Patent
Ono et al.

(10) Patent No.: US 11,336,267 B2
(45) Date of Patent: May 17, 2022

(54) DUTY RATIO CORRECTION CIRCUIT AND SIGNAL GENERATION CIRCUIT

(71) Applicant: Sony Semiconductor Solutions Corporation, Kanagawa (JP)

(72) Inventors: Kazutoshi Ono, Fukuoka (JP); Nobuhiko Shigyo, Fukuoka (JP); Hideo Maeda, Fukuoka (JP); Toshio Suzuki, Kanagawa (JP); Yoshikatsu Jingu, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/269,840

(22) PCT Filed: May 10, 2019

(86) PCT No.: PCT/JP2019/018674
§ 371 (c)(1),
(2) Date: Feb. 19, 2021

(87) PCT Pub. No.: WO2020/044664
PCT Pub. Date: Mar. 5, 2020

(65) Prior Publication Data
US 2021/0184656 A1 Jun. 17, 2021

(30) Foreign Application Priority Data
Aug. 28, 2018 (JP) .............. JP2018-159136

(51) Int. Cl.
*H03K 3/017* (2006.01)
*H03H 7/06* (2006.01)
*H03H 7/38* (2006.01)

(52) U.S. Cl.
CPC .............. *H03K 3/017* (2013.01); *H03H 7/06* (2013.01); *H03H 7/38* (2013.01)

(58) Field of Classification Search
CPC ............. H03K 3/017; H03H 7/06; H03H 7/38
See application file for complete search history.

(56) References Cited

U.S. PATENT DOCUMENTS 6,198,322 B1 * 3/2001 Yoshimura ............. H03K 5/133
327/175
6,320,438 B1 * 11/2001 Arcus .................. H03K 5/1565
327/165

(Continued)

FOREIGN PATENT DOCUMENTS

JP        07-264018 A     10/1995
JP        2000-68797 A     3/2000

(Continued)

OTHER PUBLICATIONS

International Search Report (PCT/ISA/210), International Application No. PCT/JP2019/018674, dated Jun. 28, 2019.

(Continued)

*Primary Examiner* — Sibin Chen
(74) *Attorney, Agent, or Firm* — Michael Best & Friedrich LLP

(57) ABSTRACT

Duty signal ratio and signal generation circuits with clock signal duty ratio stabilization under decreased power supply conditions are disclosed. In one example, a duty ratio correction circuit includes an inverting buffer, a capacitor, a low pass filter, an error amplifier, and an adjusting unit. The capacitor adjusts the rising and falling times of an inverted signal output from the inverting buffer. The low pass filter extracts a low frequency component of the inverted signal. The error amplifier adjusts a duty ratio of the inverted signal by controlling at least one of an output source current and an output sink current of the inverting buffer on the basis of a difference between the extracted low frequency component (Continued)

and a reference signal. The adjusting unit adjusts the control of the inverting buffer by the error amplifier.

18 Claims, 14 Drawing Sheets

(56) References Cited

U.S. PATENT DOCUMENTS

| | | |
|---|---|---|
| 2002/0084817 A1 | 7/2002 | Nair et al. |
| 2006/0022652 A1 | 2/2006 | Nishimura et al. |

FOREIGN PATENT DOCUMENTS

| | | |
|---|---|---|
| JP | 2003-289242 A | 10/2003 |
| JP | 2006-65836 A | 3/2006 |
| JP | 2013-236174 A | 11/2013 |
| WO | 2018/037946 A1 | 3/2018 |

OTHER PUBLICATIONS

Notification of Transmittal of the International Search Report and the Written Opinion of the International Searching Authority, or the Declaration (PCT/ISA/220), International Application No. PCT/JP2019/018674, dated Jul. 9, 2019.

* cited by examiner a b c

_US 11,336,267 B2_

DUTY RATIO CORRECTION CIRCUIT AND SIGNAL GENERATION CIRCUIT

TECHNICAL FIELD

The present disclosure relates to a duty ratio correction circuit and a signal generation circuit. More specifically, the present disclosure relates to a duty ratio correction circuit for correcting the duty ratio of a signal and a signal generation circuit including the duty ratio correction circuit.

BACKGROUND ART

Conventionally, a transmitter conforming to the BLE standard has been used as a transmitter of a mobile device. A signal transmitted from this transmitter needs to have a duty ratio of 50% to reduce secondary distortion. This is to reduce transmission of interference radio waves. As a transmitter as described above, a transmitter that corrects the duty ratio of a signal generated by a Digital Controlled Oscillator (DCO) to 50%, then amplifies the signal by a power amplifier, and transmits the signal from an antenna is used. As a circuit that corrects the duty ratio of a signal as described above, for example, a duty ratio correction circuit having a circuit that controls the rising timing of the clock signal has been proposed (see, for example, Patent Document 1).

This duty ratio correction circuit includes a Complementary Metal Oxide Semiconductor (CMOS) inverter including a p-channel MOS transistor and an n-channel MOS transistor. The source of the p-channel MOS transistor of this CMOS inverter is connected to a power supply line Vdd via a second p-channel MOS transistor, and the source of the n-channel MOS transistor is grounded via a second n-channel MOS transistor. The gate of the second p-channel MOS transistor is biased to a predetermined voltage. On the other hand, a signal for feedback control is input to the gate of the second n-channel MOS transistor. Specifically, a low-pass filter generates a signal according to the duty ratio from the output signal of the CMOS inverter, and negatively feeds the signal back to the gate of the second n-channel MOS transistor described above. With such a configuration, the rising time of the clock signal input to the CMOS inverter is adjusted so that the duty ratio is adjusted.

CITATION LIST

Patent Document

Patent Document 1: Japanese Patent Application Laid-Open No. 2000-068797

SUMMARY OF THE INVENTION

Problems to be Solved by the Invention

According to the above-described conventional technique, the duty ratio of the clock signal cannot be adjusted when the power supply voltage is reduced, which is disadvantageous. In order to reduce power consumption, it is necessary to lower the power supply voltage of the transmitter. However, in the above-described conventional technique, the second p-channel MOS transistor and the second n-channel MOS transistor are connected in series to the CMOS inverter. Therefore, the drain-source voltage Vds of the second n-channel MOS transistor becomes insufficient when the power supply voltage is reduced. This lowers the adjustment efficiency of the rising time, and thus lowers the gain of the feedback control system, disabling adjustment of the duty ratio of the clock signal, which is disadvantageous.

The present disclosure has been made in view of the above-described disadvantages, and an object of the present disclosure is to stabilize the adjustment of the duty ratio of a signal even when the power supply voltage is reduced.

Solutions to Problems

The present disclosure has been made to solve the above-described disadvantages, and a first aspect thereof is a duty ratio correction circuit including: an inverting buffer configured to invert a signal that is input; a capacitor connected to an output of the inverting buffer to adjust rising time and falling time of the inverted signal; a low pass filter configured to extract a low frequency component of the inverted signal; an error amplifier configured to adjust a duty ratio of the inverted signal by controlling at least one of an output source current or an output sink current of the inverting buffer on the basis of a difference between the extracted low frequency component and a reference signal to change at least one of a rising edge or a falling edge of the inverted signal; and an adjusting unit configured to adjust the control of the inverting buffer by the error amplifier.

Furthermore, in the first aspect, the duty ratio may further include a constant current power supply unit configured to supply a power supply current to the inverting buffer, in which the error amplifier may adjust the duty ratio of the inverted signal by outputting a control signal for controlling the power supply current of the constant current power supply unit to change at least one of the rising edge or the falling edge of the inverted signal, and the adjusting unit may adjust the control of the inverting buffer by the error amplifier by adjusting the control signal that is output.

Furthermore, in the first aspect, the adjusting unit may include a current mirror circuit to which a power supply voltage is applied, and may adjust the output control signal by superimposing a mirror current of the current mirror circuit as an adjustment signal on the output control signal.

Furthermore, in the first aspect, the constant current power supply unit may include a source constant current power supply unit configured to supply a source-side power supply current to the inverting buffer and a sink constant current power supply unit configured to supply a sink-side power supply current to the inverting buffer.

Furthermore, in the first aspect, the error amplifier may include a source-side error amplifier configured to output a control signal to the source constant current power supply unit and a sink-side error amplifier configured to output a control signal to the sink constant current power supply unit.

Furthermore, in the first aspect, the duty ratio correction circuit may further include a bias circuit configured to apply a predetermined bias voltage to the control signal and supply the control signal to the source-side constant current power supply unit and the sink-side constant current power supply unit.

Furthermore, in this first aspect, the duty ratio correction circuit may further include an offset adjusting unit configured to adjust an offset of the error amplifier.

Furthermore, in this first aspect, the inverting buffer may include a p-channel MOS transistor and an n-channel MOS transistor having drain terminals that are commonly connected, and the drain terminals that are commonly connected work as an output terminal of the inverting buffer itself.

Furthermore, in this first aspect, the inverting buffer may include a capacitor connected between each of gates of the p-channel MOS transistor and the n-channel MOS transistor and an input terminal of the inverting buffer itself.

Furthermore, a second aspect of the present disclosure is a signal generation circuit including: an oscillator circuit configured to generate a signal; an inverting buffer configured to invert the signal; a capacitor connected to an output of the inverting buffer to adjust rising time and falling time of the inverted signal; a low pass filter configured to extract a low frequency component of the inverted signal; an error amplifier configured to adjust a duty ratio of the inverted signal by controlling at least one of an output source current or an output sink current of the inverting buffer on the basis of a difference between the extracted low frequency component and a reference signal to change at least one of a rising edge or a falling edge of the inverted signal; and an adjusting unit configured to adjust the control of the inverting buffer by the error amplifier.

By adopting the above-described embodiment, the error amplifier has an effect that when the error amplifier controls at least one of the output source current or the output sink current of the inverting buffer to adjust the duty ratio of the inverted signal, the control by the error amplifier is adjusted by the adjusting unit. Adjustment by the adjusting unit according to the change in the power supply voltage is assumed.

Effects of the Invention

The present disclosure has an excellent effect of stabilizing the adjustment of the duty ratio of the clock signal even when the power supply voltage is reduced.

MODE FOR CARRYING OUT THE INVENTION

Figure 1:
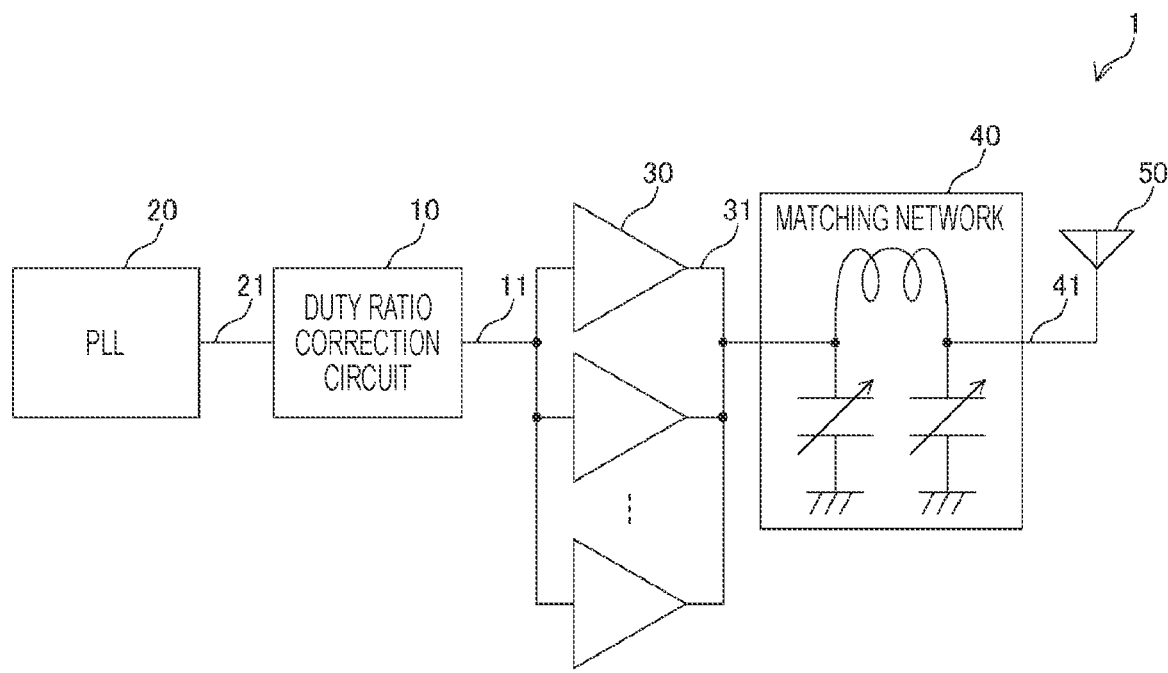
FIG. 1 is a diagram illustrating a configuration example of a transmitter according to an embodiment of the present disclosure.

Next, aspects for carrying out the present disclosure (hereinafter, referred to as embodiments) will be described with reference to the drawings. In the drawings to be referenced below, the same or similar reference signs are given to the same or similar parts. However, the drawings are schematic, and the dimensional ratio and the like of each part do not always match the actual ones. Furthermore, it is needless to say that the drawings may include portions having different dimensional relationships and ratios. Furthermore, the embodiments will be described in the following order.
1. First Embodiment
2. Second Embodiment
3. Third Embodiment
4. Fourth Embodiment
5. Fifth Embodiment 1. First Embodiment

[Configuration of Transmitter]

FIG. 1 is a diagram illustrating a configuration example of a transmitter according to an embodiment of the present disclosure. A transmitter 1 in the figure includes a Phase Locked Loop (PLL) 20, a duty ratio correction circuit 10, power amplifiers 30, a matching network 40, and a transmitting antenna 50. The configuration of the duty ratio correction circuit 10 will be described by taking this transmitter 1 as an example. Note that the PLL 20 and the duty ratio correction circuit 10 form a signal generation circuit.

The PLL 20 is a circuit that generates a clock signal. This PLL 20 has a built-in oscillator circuit and generates a clock signal (square wave) of desired frequency and phase. The clock signal is input to the duty ratio correction circuit 10 via the signal line 21. Note that the PLL 20 is an example of the oscillator circuit described in the claims. The clock signal is an example of the signal described in the claims.

The duty ratio correction circuit 10 is a circuit that corrects the duty ratio of the clock signal output from the PLL 20 to 50%. When the duty ratio of the clock signal is not 50%, radio waves with secondary distortion are transmitted from the transmitting antenna 50, and the interference margin is reduced. Therefore, the duty ratio correction circuit 10 is arranged to correct the duty ratio to 50%. The clock signal whose duty ratio has been corrected is output to the power amplifiers 30 via a signal line 11.

The power amplifiers 30 are amplifiers that amplify a clock signal whose duty ratio has been corrected. Class D amplifiers can be used as these power amplifiers 30. In the transmitter 1 illustrated in the figure, the plurality of power amplifiers 30 is connected in parallel to improve the transmission power.

The matching network 40 is a circuit that performs impedance matching between the power amplifiers 30 and the transmitting antenna 50. The matching network 40 in the figure is configured as a n-type filter and allows the fundamental wave of the amplified clock signal to pass.

The transmitting antenna 50 is an antenna that transmits the fundamental wave of the clock signal from the matching network 40.

[Configuration of Duty Ratio Correction Circuit]

Figure 2:
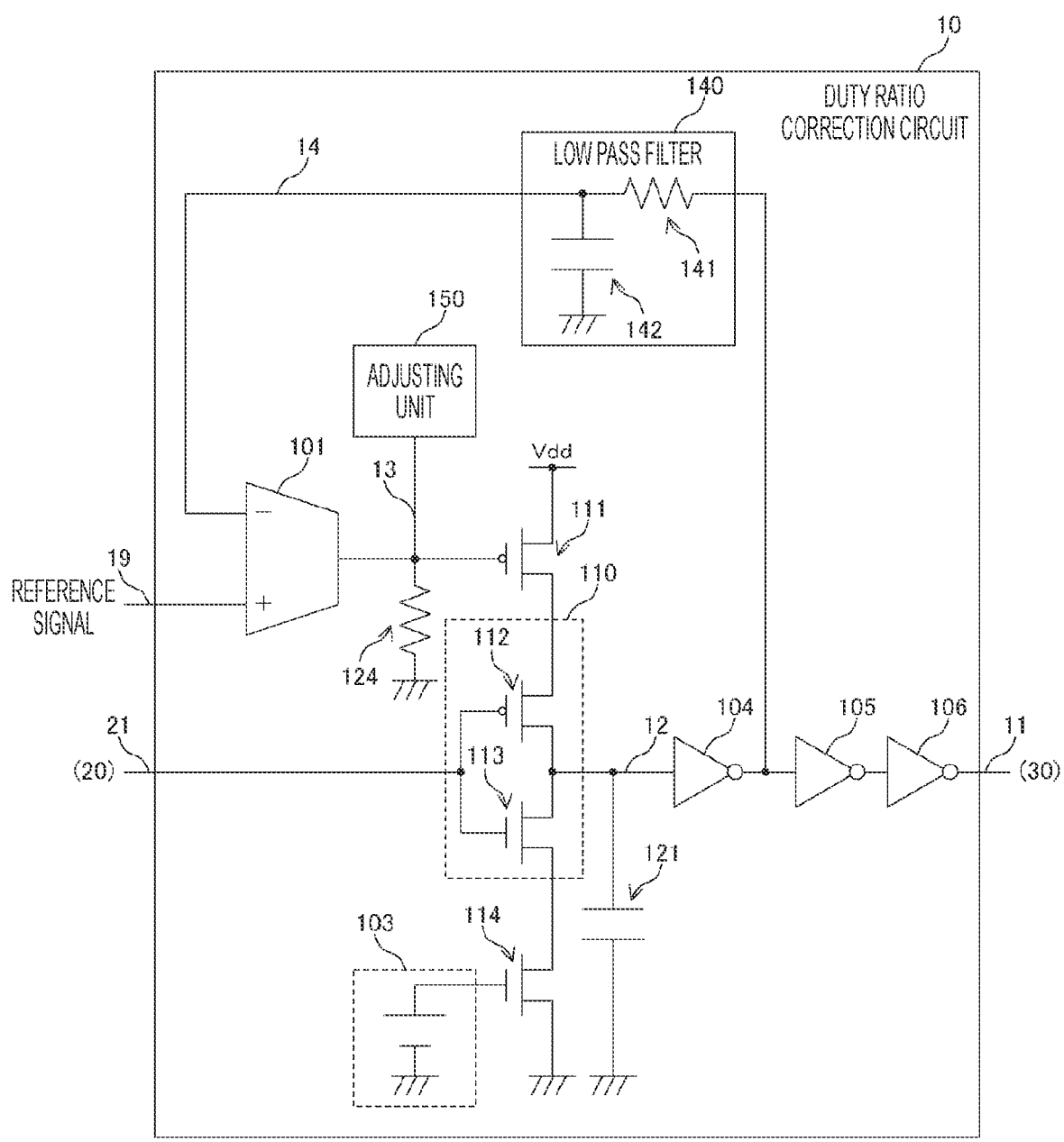
FIG. 2 is a diagram illustrating a configuration example of a duty ratio correction circuit according to a first embodiment of the present disclosure.

FIG. 2 is a diagram illustrating a configuration example of a duty ratio correction circuit according to a first embodiment of the present disclosure. The duty ratio correction circuit 10 in the figure includes an error amplifier 101, a bias circuit 103, inverting buffers 104 to 106, MOS transistors 111 to 114, a capacitor 121, a resistor 124, a low pass filter 140, and an adjusting unit 150. Note that as the MOS transistors 111 and 112, p-channel MOS transistors can be used. As the MOS transistors 113 and 114, n-channel MOS transistors can be used. The power supply line Vdd for supplying power is wired in the duty ratio correction circuit 10 in the figure.

The signal line 21 is connected to the gate of the MOS transistor 112 and the gate of the MOS transistor 113. The drain of the MOS transistor 112 is connected to the drain of the MOS transistor 113, the input of the inverting buffer 104, and one end of the capacitor 121. The other end of the capacitor 121 is grounded. The source of the MOS transistor 112 is connected to the drain of the MOS transistor 111, and the source of the MOS transistor 111 is connected to the power supply line Vdd. The gate of the MOS transistor 111 is connected to a signal line 13. The output of the adjusting unit 150, the output of the error amplifier 101, and one end of the resistor 124 are further connected to the signal line 13. The other end of the resistor 124 is grounded. The source of the MOS transistor 113 is connected to the drain of the MOS transistor 114, and the source of the MOS transistor 114 is grounded. The gate of the MOS transistor 114 is connected to the bias circuit 103.

The output of the inverting buffer 104 is connected to the input of the inverting buffer 105 and the input of the low pass filter 140. The output of the inverting buffer 105 is connected to the input of inverting buffer 106, and the output of inverting buffer 106 is connected to the signal line 11. The output of the low pass filter 140 is connected to the inverting input of the error amplifier 101. The non-inverting input of the error amplifier 101 is connected to a signal line 19. Note that a reference signal generated by a reference signal generation unit (not illustrated) is input to the signal line 19.

The bias circuit 103 is a circuit that includes a voltage source and supplies a predetermined bias voltage to the gate of the MOS transistor 114.

The MOS transistors 112 and 113 form an inverting buffer 110. The inverting buffer 110 inverts the logic of the clock signal input via the signal line 21 and outputs the signal to a signal line 12. The MOS transistor 114 is connected to the source of the MOS transistor 113. As described above, a bias voltage is applied to the gate of the MOS transistor 114 by the bias circuit 103, and the MOS transistor 114 is connected between the source of the MOS transistor 113 and the ground. Therefore, the MOS transistor 114 works as a constant current power supply unit that supplies a sink-side power supply current to the MOS transistor 113. Note that the MOS transistor 114 is an example of the sink constant current power supply unit described in the claims.

The MOS transistor 111 is connected between the power supply line Vdd and the drain of the MOS transistor 112, and supplies the source-side power supply current to the MOS transistor 112. The output of the error amplifier 101 is connected to the gate of the MOS transistor 111 via the signal line 13. Therefore, the MOS transistor 111 supplies the source-side power supply current corresponding to the output of the error amplifier 101 to the MOS transistor 112. Note that the MOS transistor 111 is an example of the source constant current power supply unit described in the claims.

The capacitor 121 is a capacitor that adjusts the rising time and falling time of the clock signal inverted by the inverting buffer 110. As described above, the MOS transistors 111 and 114 are connected to the inverting buffer 110 to supply power supply currents on the source side and the sink side. The capacitor 121 connected to the output of the inverting buffer 110 is charged and discharged by the output source current and the output sink current based on these power supply currents on the source side and the sink side. Therefore, the output clock signal of the inverting buffer 110 becomes a signal having ramp rising and falling edges. In this way, the MOS transistors 111 and 114 and the capacitor 121 adjust the rising time and the falling time of the inverted clock signal.

The inverting buffer 104 inverts the logic of the output clock signal of the inverting buffer 110 and also shapes the waveform. As described above, the output clock signal of the inverting buffer 110 becomes a signal having ramp rising and falling edges. The inverting buffer 104 shapes this clock signal into a signal having steep rising and falling edges. The clock signal after the shaping is output to the signal line 11 via the inverting buffers 105 and 106 connected in series. Furthermore, the clock signal shaped by the inverting buffer 104 is input also to the low pass filter 140.

The low pass filter 140 is a filter that extracts a low frequency component of the clock signal molded by the inverting buffer 104. The low pass filter 140 includes a resistor 141 and a capacitor 142 connected in series, cuts off a high frequency component of the clock signal, and allows the low frequency component to pass. By setting the cutoff frequency of the low pass filter 140 sufficiently low, it is possible to extract a signal according to the duty ratio of the clock signal. When the duty ratio of the clock signal is 50%, a signal having a voltage approximately ½ of the power supply voltage (Vdd) is output from the output of the low pass filter 140. When the duty ratio of the clock signal exceeds 50%, a signal having a voltage higher than ½ of Vdd is output, and when the duty ratio of the clock signal is lower than 50%, a signal having a voltage lower than ½ of Vdd is output. The output signal of the low pass filter 140 is input to the inverting input of the error amplifier 101 via a signal line 14.

The error amplifier 101 adjusts the duty ratio of the inverted clock signal. The error amplifier 101 controls at least one of the output source current or the output sink current of the inverting buffer 110 on the basis of the difference between the low frequency component of the clock signal input from the low pass filter 140 and the reference signal input via the signal line 19. Thus, at least one of the rising edge or the falling edge of the inverted clock signal is changed, and the duty ratio of the inverted clock signal is adjusted. The error amplifier 101 in the figure includes a transconductance amplifier. This transconductance amplifier is an amplifier that outputs a current according to the difference between the voltages applied to the inverting input and the non-inverting input. The error amplifier 101 in the figure amplifies the difference between the voltages applied to the inverting input and the non-inverting input, converts the difference into a current, and outputs the current. When the voltage of the inverting input is higher than that of the non-inverting input of the error amplifier 101, the sink-side current flows from the error amplifier 101, and when the voltage of the inverting input is lower than that of the non-inverting input of the error amplifier 101, the source-side current flows from the amplifier 101.

The output current of the error amplifier 101 is converted into a voltage by the resistor 124. The output voltage of the error amplifier 101 obtained by the conversion is applied to the gate of the MOS transistor 111 via the signal line 13. Thus, a voltage corresponding to the difference between the reference signal and the low frequency component of the clock signal is applied to the gate of the MOS transistor 111 as a control signal. The source-side power supply current supplied by the MOS transistor 111 is controlled by the control signal that is the output of the error amplifier 101. In this way, by feeding back the output clock signal of the inverting buffer 110 to the input of the error amplifier 101 via the low pass filter 140, the duty ratio of the output clock signal of the inverting buffer 110 can be changed, so that the output clock signal can be corrected. Note that since the MOS transistor 111 is a p-channel MOS transistor and the gate of the MOS transistor 111 is pulled down by the resistor 124, the error amplifier 101 supplies the current on the source side to the signal line 13 to control the source-side power supply current of the MOS transistor 111. The details of the duty ratio correction will be described later.

The adjusting unit 150 adjusts the control of the inverting buffer 110 by the error amplifier 101. The adjusting unit 150 adjusts the control signal output from the error amplifier 101. Specifically, the adjusting unit 150 outputs a current (adjustment signal) to the signal line 13. Since this adjustment signal flows through the resistor 124, the adjustment signal is superimposed on the control signal of the error amplifier 101, converted into a voltage, and applied to the gate of the MOS transistor 111. The adjustment by the adjusting unit 150 can be performed on the basis of, for example, the change in the power supply voltage Vdd. When the power supply voltage Vdd changes and the drain-source voltage Vds of the MOS transistor 111 then changes, the change efficiency of the duty ratio changes and the loop gain of the feedback control system changes. In such a case, the adjusting unit 150 outputs an adjustment signal that cancels the change in the drain-source voltage Vds of the MOS transistor 111, so that the change in the change efficiency of the duty ratio can be reduced. Thus, the feedback control system by the error amplifier 101 or the like can be stabilized.

[Configuration of Adjusting Unit]

Figure 3:
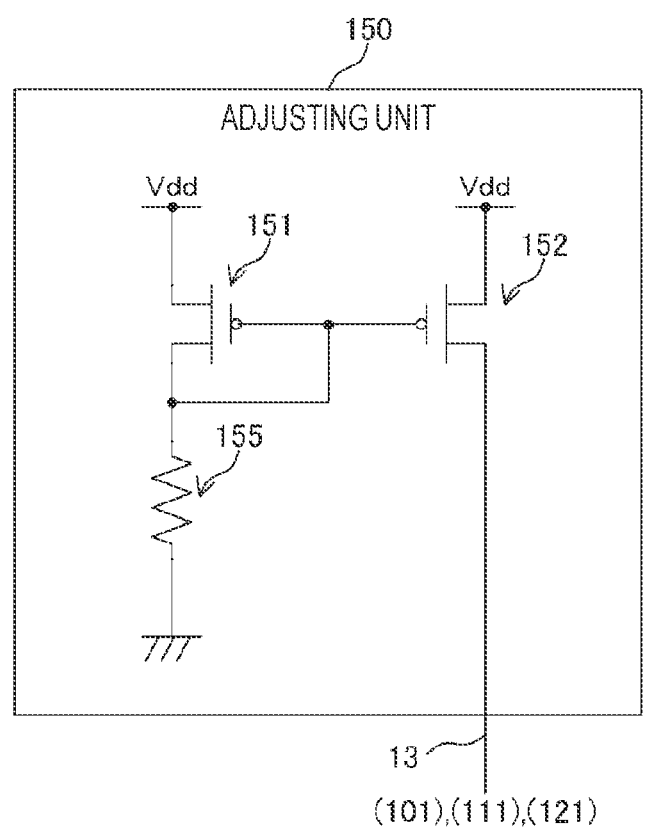
FIG. 3 is a diagram illustrating a configuration example of an adjusting unit according to the first embodiment of the present disclosure.

FIG. 3 is a diagram illustrating a configuration example of the adjusting unit according to the first embodiment of the present disclosure. The figure is a circuit diagram illustrating a configuration example of the adjusting unit 150. The adjusting unit 150 in the figure includes MOS transistors 151 and 152 and a resistor 155. As the MOS transistors 151 and 152, p-channel MOS transistors can be used.

The sources of the MOS transistors 151 and 152 are commonly connected to the power supply line Vdd. The gate of the MOS transistor 151 is connected to the drain of the MOS transistor 151, the gate of the MOS transistor 152, and one end of the resistor 155. The other end of the resistor 155 is grounded. The drain of the MOS transistor 152 is connected to the signal line 13.

The MOS transistors 151 and 152 form a current mirror circuit. A current according to the power supply voltage Vdd and the resistor 155 flows through the MOS transistor 151. The current flowing through the MOS transistor 151 is mirrored by the MOS transistor 152 and output to the signal line 13. When the power supply voltage Vdd changes, the current of the MOS transistor 151 also changes, and current output to the signal line 13 by the MOS transistor 152 also changes. Furthermore, even when, for example, the threshold values or the like of the MOS transistors arranged in the duty ratio correction circuit 10 change due to variations in the manufacturing process of semiconductor elements included in the duty ratio correction circuit 10, the current of the MOS transistor 151 and the current output to the signal line 13 by the MOS transistor 152 change.

Furthermore, also when the threshold values or the like of the MOS transistors arranged in the duty ratio correction circuit 10 changes due to, for example, change in the ambient temperature, the current of the MOS transistor 151 and the current output to the signal line 13 by the MOS transistor 152 similarly change. In this way, the adjusting unit 150 can output a current, as an adjustment signal, according to the power supply line Vdd, the variation in the manufacturing process, the temperature change, and the like to the signal line 13. Note that when the power supply voltage Vdd is low, the resistor 155 is not needed.

[Correction of Duty Ratio]

Figure 4:
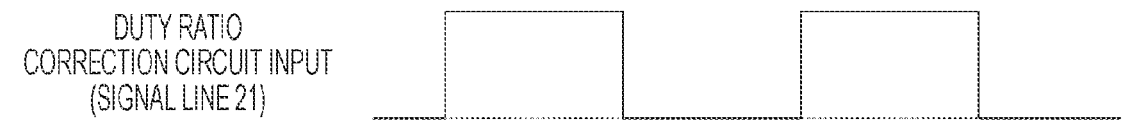
FIG. 4 is a diagram illustrating an example of correction of the duty ratio according to the first embodiment of the present disclosure.
Figure 4:
Figure 4:
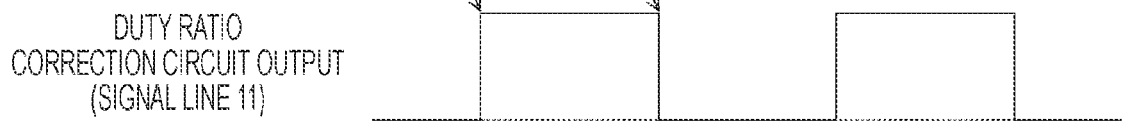
Figure 4:
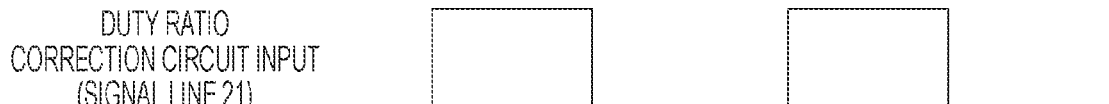
Figure 4:
Figure 4:
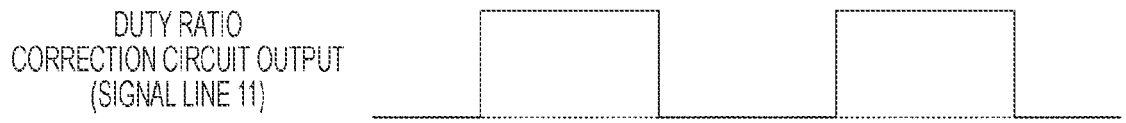
Figure 4:
Figure 4:
Figure 4:
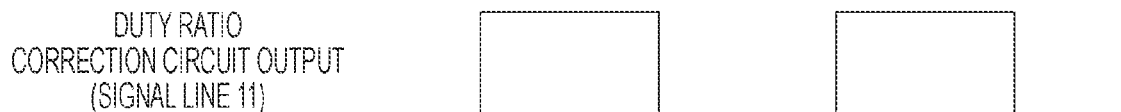

FIG. 4 is a diagram illustrating an example of correction of the duty ratio according to the first embodiment of the present disclosure. The figure illustrates how the duty ratio of the input clock signal is adjusted. In the figure, the duty ratio correction circuit input represents a clock signal input from the signal line 21. The inverting buffer output represents the output clock signal of the inverting buffer 110 output to the signal line 12. The duty ratio correction circuit output represents a clock signal that has a duty ratio having been corrected and that is output to the signal line 11. Furthermore, the dashed line in the figure represents 0 V (ground potential). The dotted line represents the threshold value of the inverting buffer 104. This threshold value is approximately ½ of the power supply voltage Vdd. Furthermore, a, b, and c of the figure represent cases where the duty ratios of the input clock signals are 50%, lower than 50%, and higher than 50%, respectively.

In a of the figure, the clock signal having a duty ratio of 50% is inverted by the inverting buffer 110 and converted by the capacitor 121 into a waveform that changes like a ramp shape at the rising and falling edges. Since the duty ratio of the clock signal is 50%, the clock signal output from the inverting buffer 110 has a waveform having the rising time and the falling time that are the same. Thereafter, the inverting buffer 104 inverts the clock signal again to shape the rising and falling edges. At this time, the source-side current (control signal) from the output of the error amplifier 101 and the source-side current (adjustment signal) from the adjusting unit 150 are output to the signal line 13, and the gate of the MOS transistor 111 is biased to the voltage based on these source-side currents. Due to this bias voltage, the source-side power supply current having the same absolute value as the sink-side power supply current of the MOS transistor 114 is supplied from the MOS transistor 111 to the inverting buffer 110. In this way, the feedback control in the steady state is performed.

In b of the figure, the duty ratio of the clock signal is lower than 50%. Thus, the output voltage of the low pass filter 140 is reduced. Therefore, the output source current of the error amplifier 101 is increased, so that the gate voltage of the MOS transistor 111 is increased. Thus, the source-side power supply current of the MOS transistor 111 is reduced, so that the rising time of the output clock signal of the inverting buffer 110 becomes longer. Since the falling time of the output clock signal of the inverting buffer 110 is the same as that in the case where the duty ratio of the clock signal is 50%, the period, in which the logic of the clock signal is "1" after the waveform is shaped by the inverting buffer 104 is extended, so that the duty ratio is adjusted to 50%.

In c of the figure, the duty ratio of the clock signal is higher than 50%. Thus, the output voltage of the low pass filter 140 is increased. Therefore, the output source current of the error amplifier 101 is reduced, so that the gate voltage of the MOS transistor 111 is reduced. Thus, the source-side power supply current of the MOS transistor 111 is increased, so that the rising time of the output clock signal of the inverting buffer 110 becomes shorter. The period, in which the logic of the clock signal is "1" after the waveform is shaped by the inverting buffer 104 is reduced, so that the duty ratio is adjusted to 50%.

[Adjustment of Control Signal]

Figure 5:
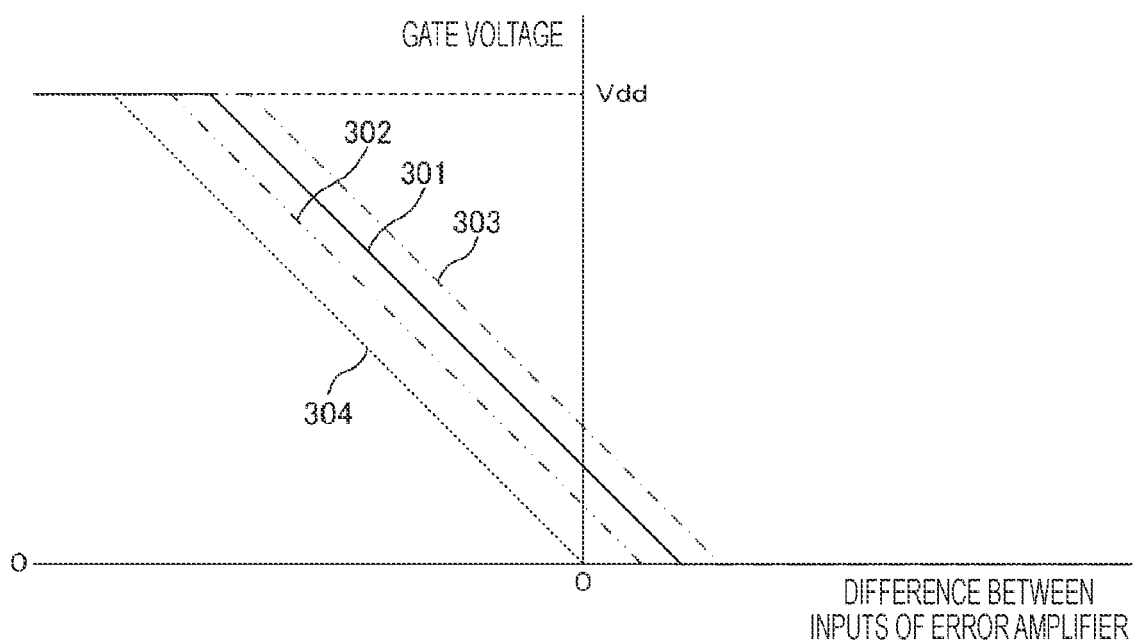
FIG. 5 is a diagram illustrating an example of adjustment of a control signal according to the first embodiment of the present disclosure.

FIG. 5 is a diagram illustrating an example of adjustment of the control signal according to the first embodiment of the present disclosure. The figure illustrates the adjustment of the control signal of the error amplifier 101 by the adjusting unit 150. The horizontal axis in the figure represents the difference between the inverting input and the non-inverting input of the error amplifier 101. The difference is a value "0" when the voltages of the inverting input and the non-inverting input are the same, and the difference is a positive value when the inverting input is higher than the non-inverting input. The vertical axis in the figure represents the gate voltage of the MOS transistor 111.

In the figure, a dashed line graph 304 represents the relationship between the input difference of the error amplifier 101 and the gate voltage of the MOS transistor 111 in a state where the feedback control is stopped. When the voltage of the inverting input of the error amplifier 101 is lower than the voltage of the non-inverting input, the source-side current corresponding to the difference between the inputs of the error amplifier 101 is output, and the gate voltage is applied to the MOS transistor 111. When the voltage of the inverting input of the error amplifier 101 becomes higher than the voltage of the non-inverting input, the error amplifier 101 operates in the direction of outputting the sink-side current. However, since the terminal of the resistor 124 that is not connected to the signal line 13 is grounded, the sink-side current does not flow, and the gate voltage of the MOS transistor 111 becomes 0 V.

A continuous line graph 301 represents the relationship between the input difference of the error amplifier 101 and the gate voltage of the MOS transistor 111 when the feedback control system described with reference to a of FIG. 4 is in a steady state. The graph 301 has a shape shifted in the direction of the positive gate voltage relative to the graph 304. A long dashed dotted line graph 303 is a graph when there are many adjustment signals in the adjusting unit 150. For example, when the power supply voltage Vdd is increased, the adjusting unit 150 increases the adjustment signal. Thus, the graph 301 shifts to the graph 303 and the gate voltage becomes generally higher. Thus, the increase in the source-side power supply current of the MOS transistor 111 is compensated, and the change in the loop gain of the feedback control system is reduced.

On the other hand, when the power supply voltage Vdd is reduced, the adjustment signal of the adjusting unit 150 is reduced. Thus, the graph 301 shifts to a long dashed double-dotted line graph 302 to make the gate voltage generally low. Thus, the reduction in the source-side power supply current of the MOS transistor 111 is compensated, and the change in the loop gain of the feedback control system is reduced.

Note that even when the threshold values or the like of the MOS transistors change due to variations in the manufacturing process, the adjusting unit 150 adjusts the control signal of the error amplifier 101. The change in the loop gain of the feedback control system can be reduced.

As described above, the duty ratio correction circuit 10 of the first embodiment of the present disclosure adjusts the control signal of the error amplifier 101 using the adjustment signal of the adjusting unit 150. Thus, the duty ratio of the clock signal can be corrected to 50% even when the power supply voltage Vdd changes.

2. Second Embodiment

The duty ratio correction circuit 10 of the first embodiment described above corrects the duty ratio of the clock signal to 50C by arranging the error amplifier 101 and performing feedback control. On the other hand, a duty ratio correction circuit 10 of a second embodiment of the present disclosure adjusts the offset of an error amplifier 101, and is different from that of the above-described first embodiment in this point.

[Configuration of Duty Ratio Correction Circuit]

Figure 6:
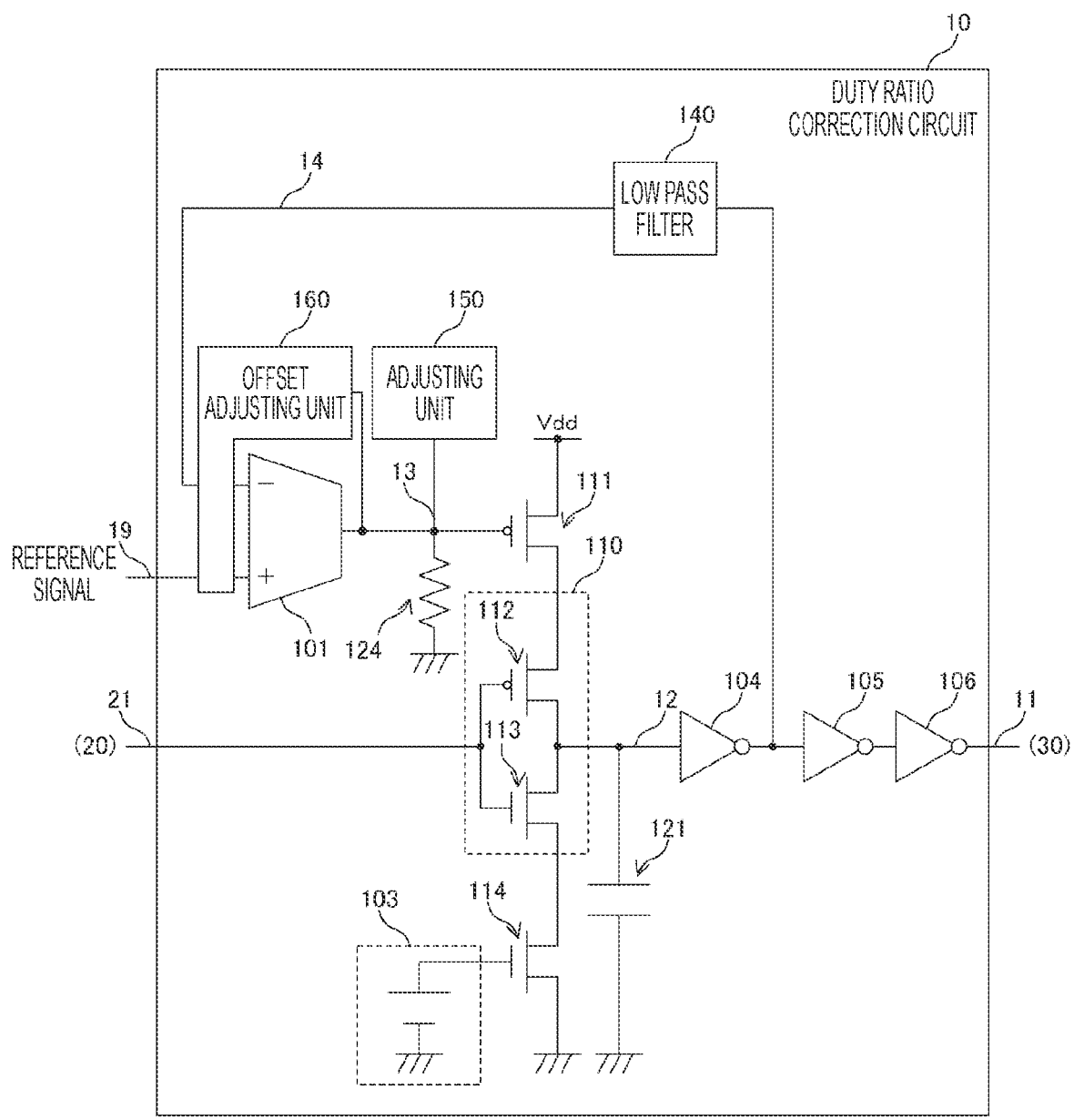
FIG. 6 is a diagram illustrating a configuration example of a duty ratio correction circuit according to a second embodiment of the present disclosure.

FIG. 6 is a diagram illustrating a configuration example of a duty ratio correction circuit according to the second embodiment of the present disclosure. The duty ratio correction circuit 10 in the figure further includes an offset adjusting unit 160, and is different from the duty ratio correction circuit 10 described with reference to FIG. 2 in this point.

The offset adjusting unit 160 in the figure adjusts the offset of the error amplifier 101 to approximately "0". In order to reduce the power consumption of a transmitter 1, the power supply voltage Vdd of the duty ratio correction circuit 10 and the like may be reduced. For example, when the power supply voltage Vdd is set to a low voltage of 1 V or lower, the allowable offset error with respect to the output of the error amplifier 101 is reduced. Therefore, by canceling the offset of the error amplifier 101, the influence of the offset error can be reduced.

[Configuration of Offset Adjusting Unit]

Figure 7:
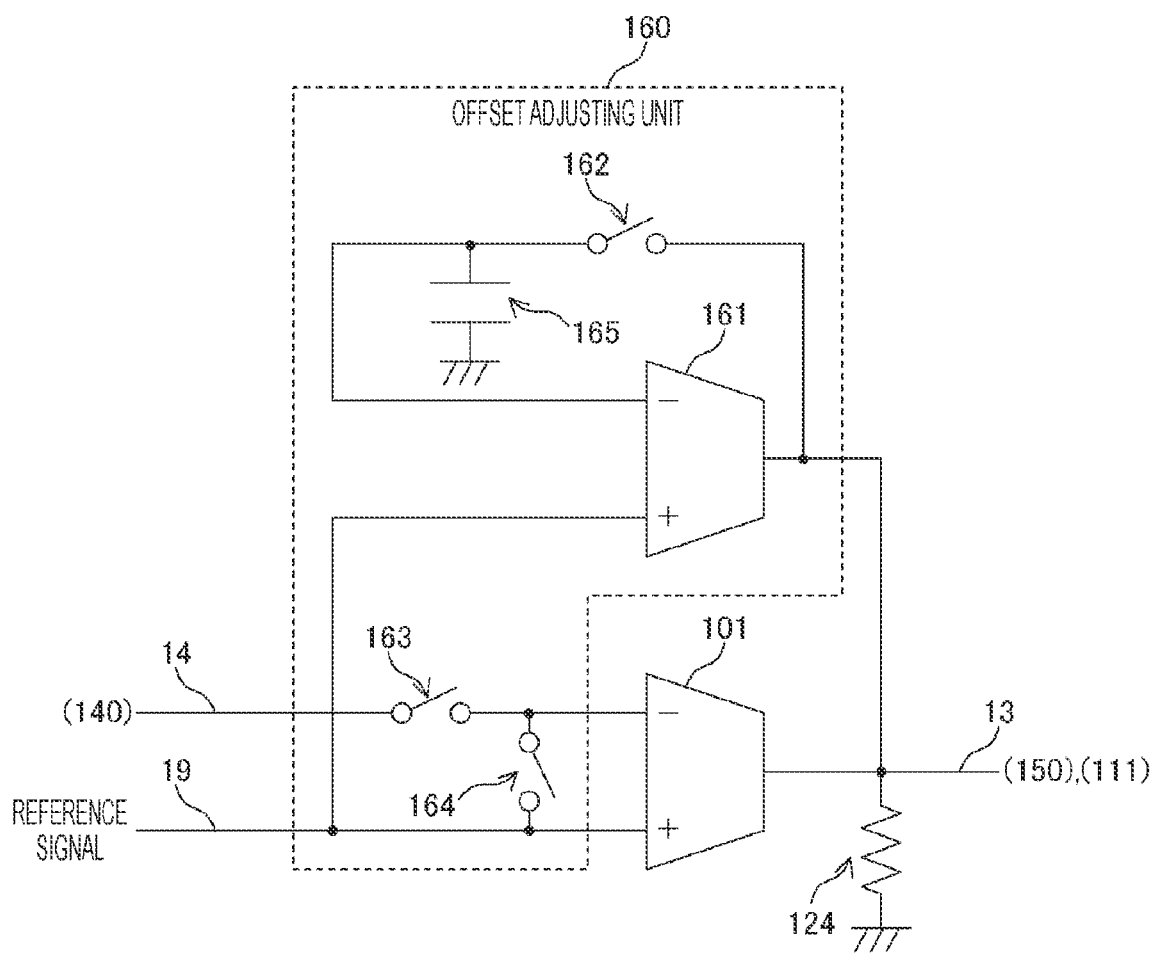
FIG. 7 is a diagram illustrating a configuration example of an offset adjusting unit according to the second embodiment of the present disclosure.

FIG. 7 is a diagram illustrating a configuration example of an offset adjusting unit according to the second embodiment of the present disclosure. The offset adjusting unit 160 in the figure includes an error amplifier 161, switches 162 to 164, and a capacitor 165.

The switch 163 is connected between a signal line 14 and the inverting input of the error amplifier 101. The switch 164 is connected between the inverting and non-inverting inputs of the error amplifier 101. The non-inverting input of the error amplifier 161 is connected to a signal line 19, and the inverting input of the error amplifier 161 is connected to the output of the error amplifier 161 via the switch 162. Furthermore, the output of the error amplifier 161 is further connected to a signal line 13. The capacitor 165 is connected between the inverting input of error amplifier 161 and the ground.

The capacitor 165 is a capacitor that holds a voltage corresponding to the offsets of the error amplifiers 101 and 161. The error amplifier 161 adjusts the offset of the error amplifier 101 by outputting a current based on the voltage held in the capacitor 165 to a signal line 13.

The offset adjusting unit 160 operates while being switched between an offset correction period and a normal operation period by a control circuit (not illustrated). During the normal operation period, the switches 162 and 164 are put in a non-conducting state, and the switch 163 is put in a conducting state. Thus, the output of a low pass filter 140 is applied to the inverting input of the error amplifier 101, and the current based on the difference from the reference signal is output. During the offset correction period, the switch 163 is put in a non-conducting state, and the switches 162 and 164 are put in a conducting state. Thus, the reference signal is input to the inverting and non-inverting inputs of the error amplifier 101 and the non-inverting input of the error amplifier 161. To the output of the error amplifier 101, a current based on its own offset is output, and the current is applied to the inverting input of the error amplifier 161 via the switch 162 and charges the capacitor 165. Thus, the capacitor 165 holds a voltage based on the offset of the error amplifier 101. At this time, the voltage based on the offset of the error amplifier 161 is also held in the capacitor 165 similarly.

Next, when the operation transitions to the normal operation period, the error amplifier 161 outputs a current based on the offset voltage held in the capacitor 165. Since the output current of the error amplifier 161 is superimposed on the output current of the error amplifier 101, the offset of the error amplifier 101 can be canceled.

The configuration of the duty ratio correction circuit 10 is similar to the configuration of the duty ratio correction circuit 10 described in the first embodiment of the present disclosure except for the part described above. Thus, the description thereof will not be provided.

As described above, the duty ratio correction circuit 10 of the second embodiment of the present disclosure can adjust the offset of the error amplifier 101 by arranging the offset adjusting unit 160. Thus, even when the power supply voltage Vdd is low, the error of the duty ratio correction can be reduced.

3. Third Embodiment

The duty ratio correction circuit 10 of the first embodiment described above controls the source-side power supply current of the MOS transistor 111. On the other hand, a duty ratio correction circuit 10 of a third embodiment of the present disclosure further controls the sink-side power supply current of a MOS transistor 114, and is different from that of the above-described first embodiment in this point.

[Configuration of Duty Ratio Correction Circuit]

Figure 8:
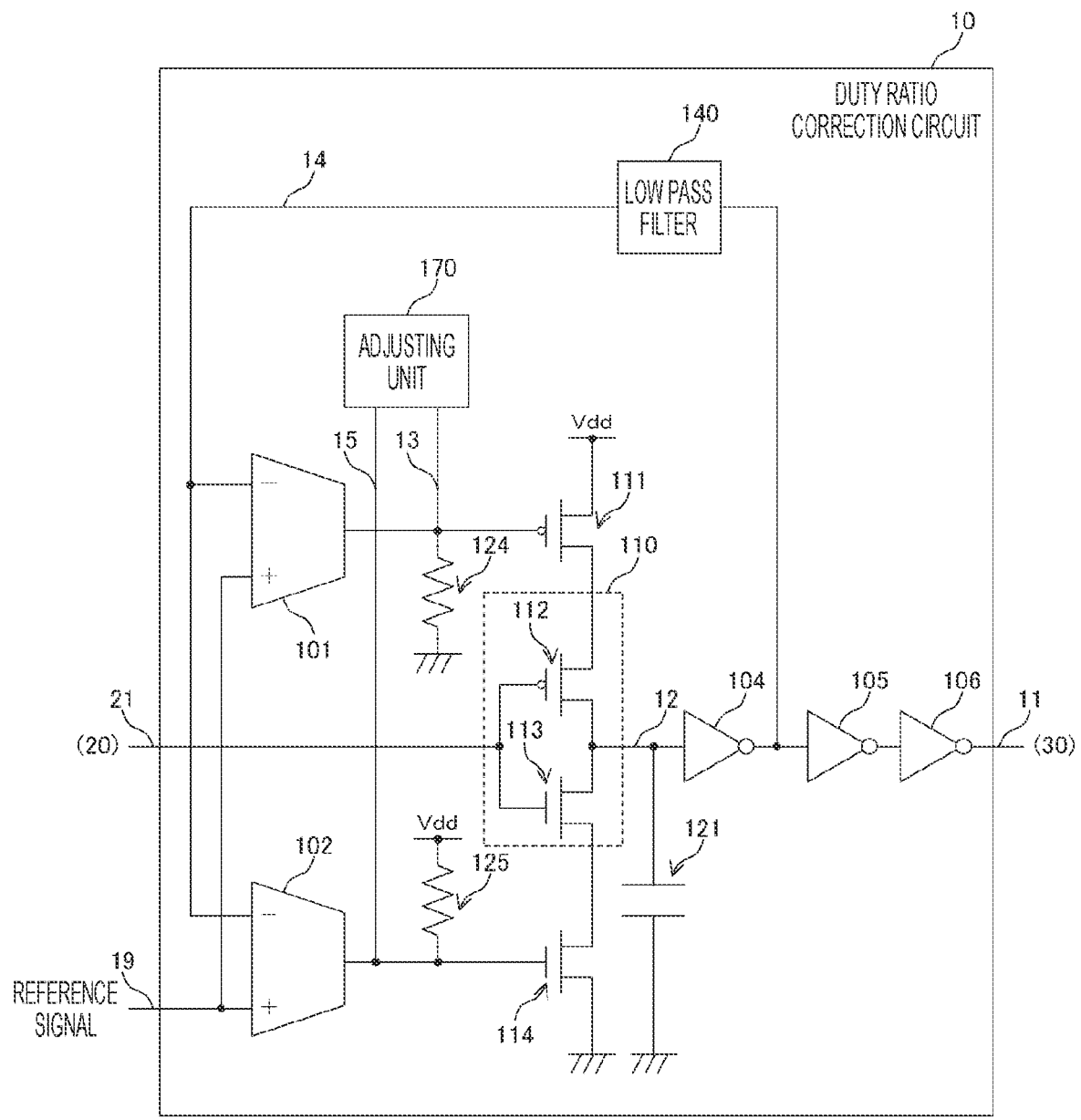
FIG. 8 is a diagram illustrating a configuration example of a duty ratio correction circuit according to a third embodiment of the present disclosure.

FIG. 8 is a diagram illustrating a configuration example of a duty ratio correction circuit according to the third embodiment of the present disclosure. The duty ratio correction circuit 10 in the figure further includes an error amplifier 102 and a resistor 125, includes an adjusting unit 170 instead of the adjusting unit 150, and removes the bias circuit 103, and thus is different from the duty ratio correction circuit 10 described with reference to FIG. 2 in this point.

The inverting input of the error amplifier 102 is connected to a signal line 14, and the non-inverting input of the error amplifier 102 is connected to a signal line 19. The output of the error amplifier 102 is connected to a signal line 15. This signal line 15 is further connected to the gate of the MOS transistor 114 and one end of the resistor 125. The other end of resistor 125 is connected to the power supply line Vdd. The adjusting unit 170 has two outputs, which are connected to signal lines 13 and 15, respectively. The wiring other than the part described above is similar to that of the duty ratio correction circuit 10 in FIG. 2, and thus the description thereof will not be provided.

To the gate of the MOS transistor 114, the output of the error amplifier 102 is connected via the signal line 15. Therefore, the MOS transistor 114 supplies the sink-side power supply current corresponding to the output of the error amplifier 102 to a MOS transistor 113. Note that the MOS transistor 114 is an example of the sink constant current power supply unit described in the claims. An error amplifier 101 is an example of the source-side error amplifier described in the claims. The error amplifier 102 is an example of the sink-side error amplifier described in the claims.

The error amplifier 102 includes a transconductance amplifier similarly to the error amplifier 101 and controls the output sink current of an inverting buffer 110 on the basis of the difference between the low frequency component of the clock signal input from a low pass filter 140 and the reference signal input via the signal line 19. Thus, the error amplifier 102 adjusts the duty ratio of the clock signal by changing the falling edge of the clock signal inverted by the inverting buffer 110. The output current of the error amplifier 102 is converted into a voltage by the resistor 125 and applied to the gate of the MOS transistor 114. That is, a voltage corresponding to the difference between the reference signal and the low frequency component of the clock signal is applied to the gate of the MOS transistor 114 as a control signal. Note that the MOS transistor 114 is an n-channel MOS transistor and the gate of the MOS transistor 114 is pulled up by the resistor 125, and thus the error amplifier 102 supplies the sink-side current to the signal line 15 to control the sink-side power supply current of the MOS transistor 114.

The adjusting unit 170 adjusts the control of the inverting buffer 110 by the error amplifiers 101 and 102. The adjusting unit 170 adjusts the control signals output from the error amplifiers 101 and 102 at the same time. Specifically, the adjusting unit 170 outputs adjustment signals to the signal lines 13 and 15, respectively.

[Configuration of Adjusting Unit]

Figure 9:
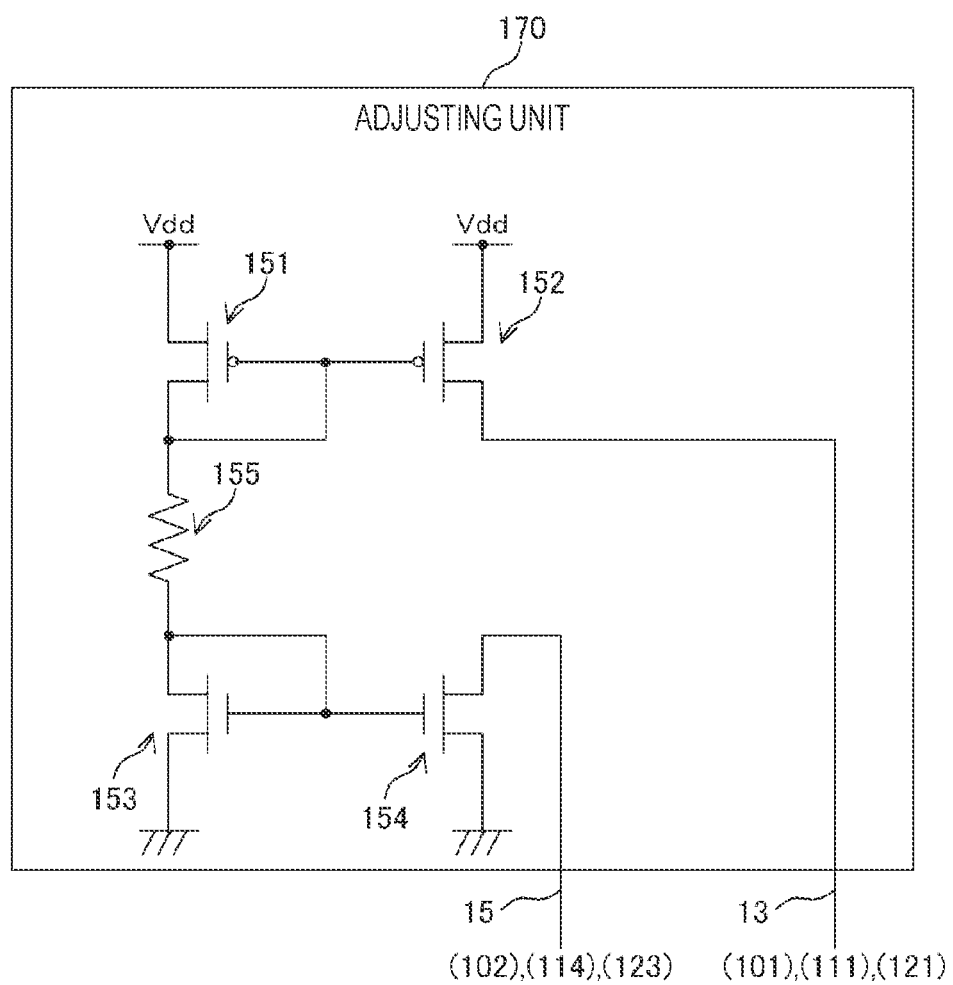
FIG. 9 is a diagram illustrating a configuration example of an adjusting unit according to the third embodiment of the present disclosure.

FIG. 9 is a diagram illustrating a configuration example of the adjusting unit according to the third embodiment of the present disclosure. The adjusting unit 170 in the figure further includes MOS transistors 153 and 154, and is different from the adjusting unit 150 described with reference to FIG. 3 in this point. As the MOS transistors 153 and 154, n-channel MOS transistors can be used.

The resistor 155 is connected between the drain of the MOS transistor 151 and the drain of the MOS transistor 153. The drain of the MOS transistor 153 is further connected to the gate of the MOS transistor 153 and the gate of the MOS transistor 154. The source of the MOS transistor 153 and the source of the MOS transistor 154 are both grounded. The drain of the MOS transistor 154 is connected to the signal line 15. The wiring other than the part described above is similar to that of the adjusting unit 150 in FIG. 3, and thus the description thereof will not be provided.

The MOS transistors 153 and 154 form a current mirror circuit. A current according to the power supply voltage Vdd and the resistor 155 flows through the MOS transistor 153. The current flowing through the MOS transistor 153 is mirrored by the MOS transistor 154 and output to the signal line 15. The adjusting unit 170 outputs the source-side current and the sink-side current as adjustment signals to the signal lines 13 and 15, respectively.

[Adjustment of Control Signal]

Figure 10:
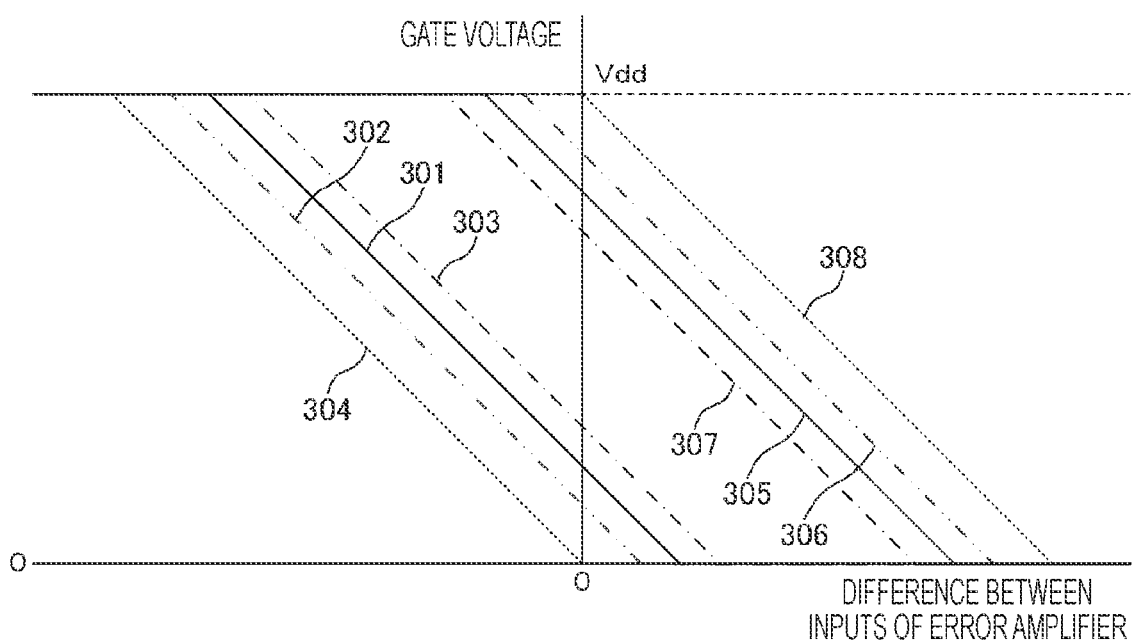
FIG. 10 is a diagram illustrating an example of adjustment of a control signal according to the third embodiment of the present disclosure.

FIG. 10 is a diagram illustrating an example of adjustment of the control signal according to the third embodiment of the present disclosure. The figure illustrates the adjustment of the control signal of the error amplifiers 101 and 102 by the adjusting unit 170. To a graph that is the same as that in FIG. 5, the same reference sign is given.

A dashed line graph 308 in the figure represents the relationship between the input difference of the error amplifier 102 and the gate voltage of the MOS transistor 114 in a state where the feedback control is stopped. When the voltage of the inverting input of the error amplifier 102 is higher than the voltage of the non-inverting input, the sink-side current corresponding to the difference between the inputs of the error amplifier 102 is output, and the gate voltage is applied to the MOS transistor 114. When the voltage of the inverting input of the error amplifier 102 becomes lower than the voltage of the non-inverting input, the error amplifier 102 operates in the direction of outputting the source-side current. However, since the terminal of the resistor 125 that is not connected to the signal line 15 is connected to the power supply line Vdd, the source-side current does not flow, and the power supply voltage Vdd is applied to the gate of the MOS transistor 114.

A continuous line graph 305 represents the relationship between the input difference of the error amplifier 102 and the gate voltage of the MOS transistor 114 when the feedback control system described with reference to a of FIG. 4 is in a steady state. The graph 305 has a shape shifted in the direction of the negative gate voltage relative to the graph 308. A long dashed dotted line graph 307 is a graph when there are many adjustment signals in the adjusting unit 170, and a long dashed double-dotted line 306 is a graph when there are a few adjustment signals in the adjusting unit 170. In this way, the increase and reduction of the sink-side power supply current of the MOS transistor 114 due to the change of the power supply voltage Vdd are compensated, and the change in the loop gain of the feedback control system is reduced.

As described above, the duty ratio correction circuit 10 of the figure includes the error amplifiers 101 and 102, and controls the source-side power supply current and the sink-side power supply current of the inverting buffer 110. Thus, the correction efficiency of the duty ratio of the clock signal can be improved.

Note that the offset of the duty ratio correction circuit 10 of FIG. 8 can be adjusted similarly to the offset of the duty ratio correction circuit 10 of FIG. 6. Specifically, the offset adjusting unit 160 described with reference to FIG. 6 is connected to the error amplifier 101, and a second offset adjusting unit having the same configuration as the offset adjusting unit 160 is connected to the error amplifier 102. Thus, the offsets of the error amplifiers 101 and 102 can be adjusted, and the error of the duty ratio correction can be reduced.

The configuration of the duty ratio correction circuit 10 is similar to the configuration of the duty ratio correction circuit 10 described in the first embodiment of the present disclosure except for the part described above. Thus, the description thereof will not be provided.

As described above, in the duty ratio correction circuit 10 of the third embodiment of the present disclosure, the two error amplifiers 101 and 102 are arranged to control the source-side power supply current and the sink-side power supply current of the inverting buffer 110. Thus, the rising time and falling time of the clock signal can be adjusted at the same time, and the correction efficiency of the duty ratio of the clock signal can be improved.

4. Fourth Embodiment

The duty ratio correction circuit 10 of the third embodiment described above uses the two error amplifiers 101 and 102. On the other hand, a duty ratio correction circuit 10 of a fourth embodiment of the present disclosure controls MOS transistors 111 and 114 by one error amplifier 101, and is different from that of the above-described third embodiment in this point.

[Configuration of Duty Ratio Correction Circuit]

Figure 11:
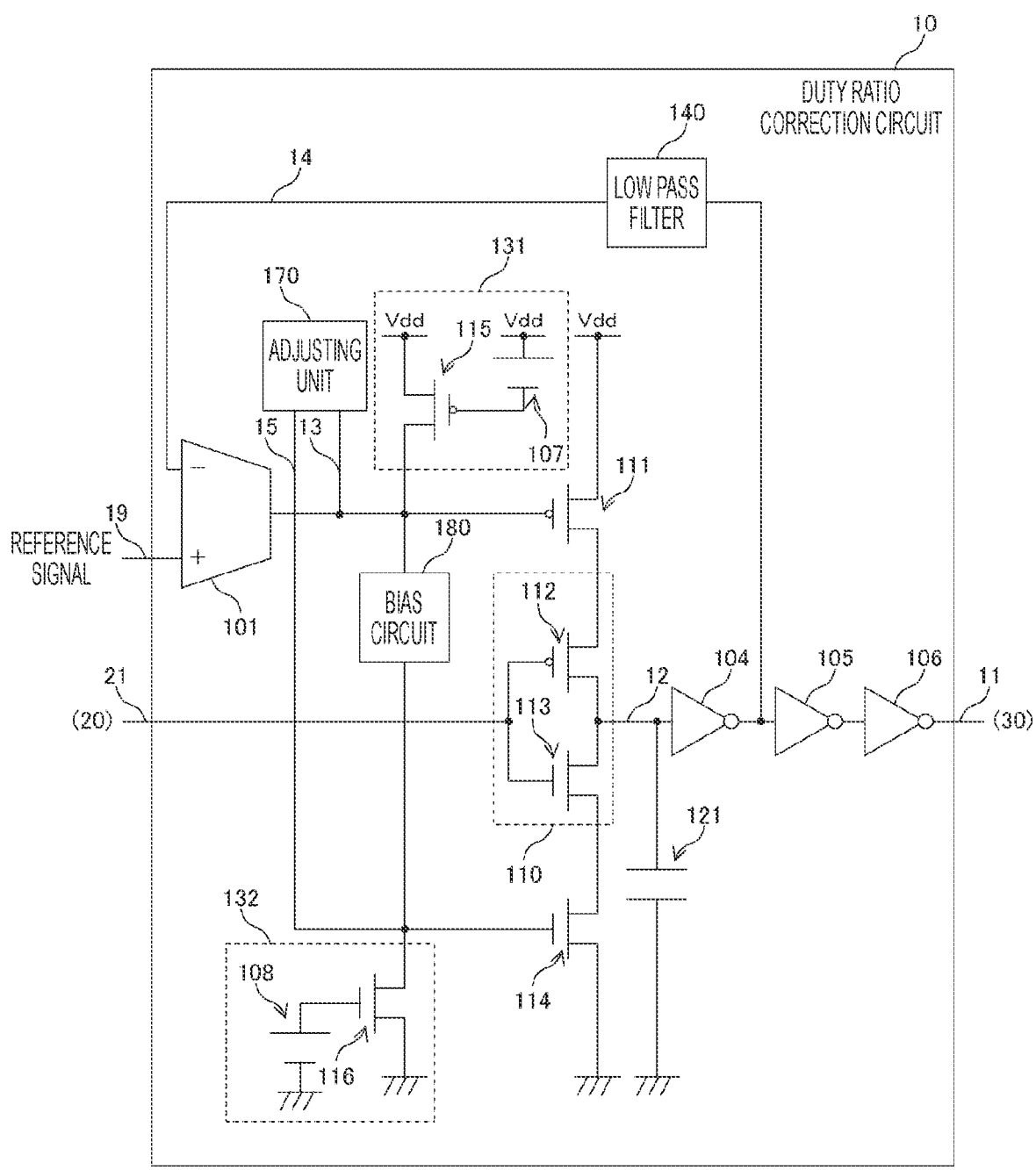
FIG. 11 is a diagram illustrating a configuration example of a duty ratio correction circuit according to a fourth embodiment of the present disclosure.

FIG. 11 is a diagram illustrating a configuration example of a duty ratio correction circuit according to the fourth embodiment of the present disclosure. The duty ratio correction circuit 10 of FIG. 8 does not have the error amplifier 102, includes constant current circuits 131 and 132 instead of the resistors 124 and 125, and further includes a bias circuit 180, and thus is different from the duty ratio correction circuit 10 described with reference to FIG. 8 in this point.

The constant current circuit 131 is a circuit that supplies a constant current on the source side. The constant current circuit 131 includes a MOS transistor 115 and a voltage source 107 that supplies a predetermined gate voltage to the MOS transistor 115. The source of the MOS transistor 115 is connected to the power supply line Vdd, and the drain is connected to a signal line 13. As the MOS transistor 115, a p-channel MOS transistor can be used.

The constant current circuit 132 is a circuit that supplies a constant current on the sink side. The constant current circuit 132 includes a MOS transistor 116 and a voltage source 108 that supplies a predetermined gate voltage to the MOS transistor 116. The source of the MOS transistor 116 is grounded, and the drain is connected to a signal line 15. As the MOS transistor 116, an n-channel MOS transistor can be used. Note that the constant current circuit 132 supplies a current having an absolute value that is the same as that of the current supplied by the constant current circuit 131.

The bias circuit 180 is a circuit connected between the signal lines 13 and 15 to supply a predetermined bias voltage. The bias circuit 180 is connected to the output of the error amplifier 101 to add the above-described bias voltage to the control signal of the error amplifier 101. To the gate of the MOS transistor 111, the control signal of the error amplifier 101 is input via the signal line 13. On the other hand, to the gate of the MOS transistor 114, the control signal of the error amplifier 101 obtained by addition of the bias voltage generated by the bias circuit 180 is applied. By arranging the bias circuit 180, the control signal of the error amplifier 101 can be supplied to the gate of the MOS transistor 114 having a potential different from that of the gate of the MOS transistor 111. The wiring other than the part described above is similar to that of the duty ratio correction circuit 10 in FIG. 8, and thus the description thereof will not be provided.

As described later, a current of the same value as that of the constant current circuits 131 and 132 flows through the bias circuit 180. When the duty ratio of the input clock signal is low and the low frequency component of the clock signal is lower than that of the reference signal, the source-side current is supplied from the error amplifier 101. At this time, in addition to the current supplied by the constant current circuit 131, the current from the error amplifier 101 flows through the bias circuit 180 and the constant current circuit 132. As the voltage between the terminals of the bias circuit 180 is increased, the output voltage of the constant current circuit 132 is also increased. Therefore, the output voltage of the constant current circuit 131 is reduced. The gate voltage of the MOS transistor 111 then becomes higher to reduce the source-side power supply current of the MOS transistor 111, so that the rising time of the clock signal output from the inverting buffer 110 becomes longer. On the other hand, since the gate voltage of the MOS transistor 114 becomes higher, the sink-side power supply current of the MOS transistor 114 is increased, and the falling time of the clock signal output from the inverting buffer 110 becomes shorter. Thus, the duty ratio of the clock signal shaped by the inverting buffer 104 is increased, and the duty ratio of the clock signal is adjusted.

When the duty ratio of the input clock signal is high and the low frequency component of the clock signal is higher than that of the reference signal, the sink-side current is supplied from the error amplifier 101. A part of the output current of the constant current circuit 131 then flows to the error amplifier 101, making the current flowing through the bias circuit 180 and the constant current circuit 132 insufficient. Therefore, as the voltage between the terminals of the bias circuit 180 is reduced, the output voltage of the constant current circuit 132 is also reduced. Therefore, the output voltage of the constant current circuit 131 is also reduced. The gate voltage of the MOS transistor 111 then becomes lower to increase the source-side power supply current of the MOS transistor 111, so that the rising time of the clock signal output from the inverting buffer 110 becomes shorter. On the other hand, since the gate voltage of the MOS transistor 114 becomes lower, the sink-side power supply current of the MOS transistor 114 is reduced, and the falling time of the clock signal output from the inverting buffer 110 becomes longer. The duty ratio of the clock signal shaped by the inverting buffer 104 is reduced, and the duty ratio of the clock signal is adjusted.

[Configuration of Bias Circuit]

Figure 12:
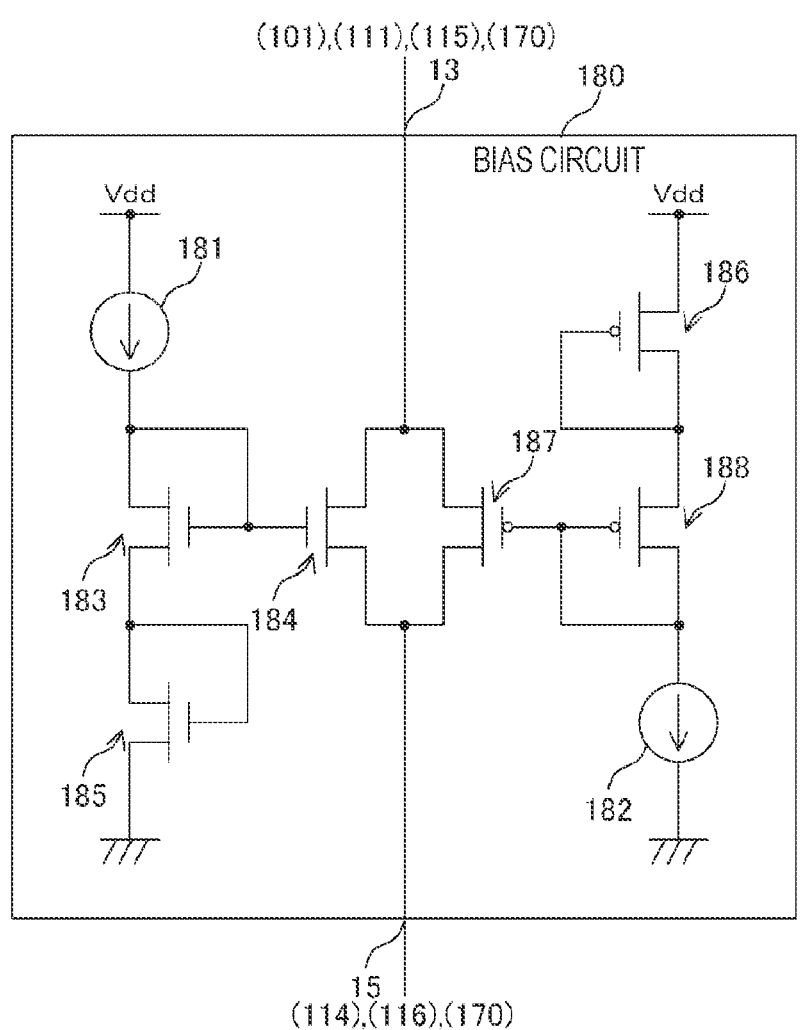
FIG. 12 is a diagram illustrating a configuration example of a bias circuit according to the fourth embodiment of the present disclosure.

FIG. 12 is a diagram illustrating a configuration example of the bias circuit according to the fourth embodiment of the present disclosure. The bias circuit 180 in the figure includes current sources 181 and 182 and MOS transistors 183 to 188. As the MOS transistors 183 to 185, n-channel MOS transistors can be used. As the MOS transistors 186 to 188, p-channel MOS transistors can be used.

The current source 181 is connected between the power supply line Vdd and the drain of the MOS transistor 183. The drain of the MOS transistor 183 is further connected to the gate of the MOS transistor 183 and the gate of the MOS transistor 184. The source of the MOS transistor 183 is connected to the drain and the gate of the MOS transistor 185, and the source of the MOS transistor 185 is grounded. The current source 182 is connected between the drain of the MOS transistor 188 and the grounding wire. The drain of the MOS transistor 188 is further connected to the gate of the MOS transistor 188 and the gate of the MOS transistor 187. The source of the MOS transistor 188 is connected to the drain and the gate of the MOS transistor 186, and the source of the MOS transistor 186 is grounded to the power supply line Vdd. The drain of the MOS transistor 184 and the source of the MOS transistor 187 are commonly connected to the signal line 13. The source of the MOS transistor 184 and the drain of the MOS transistor 187 are commonly connected to the signal line 15.

The current sources 181 and 182 in the figure supply a current that is ½ of the current supplied by the constant current circuits 131 and 132 described with reference to FIG. 11. Since the MOS transistors 183 and 184 form a current mirror circuit, the MOS transistor 184 causes a current of the same value as the supply current of the current source 181 to flow from the signal line 13 to the signal line 15. Similarly, the MOS transistor 187 causes a current of the same value as the supply current of the current source 182 to flow from the signal line 13 to the signal line 15. Due to these MOS transistors 184 and 187, the same current as that of the constant current circuits 131 and 132 flows through the bias circuit 180. Note that the MOS transistors 188 and 185 are MOS transistors that adjust the potentials at nodes of the bias circuit 180 connected to the signal lines 13 and 15.

Note that the configuration of the bias circuit 180 is not limited to this example. For example, a single resistor can be used as the bias circuit 180. In this case, a bias voltage based on the current from the constant current circuits 131 and 132 is generated across the resistor and is added to the control signal of the error amplifier 101.

[Adjustment of Control Signal]

Figure 13:
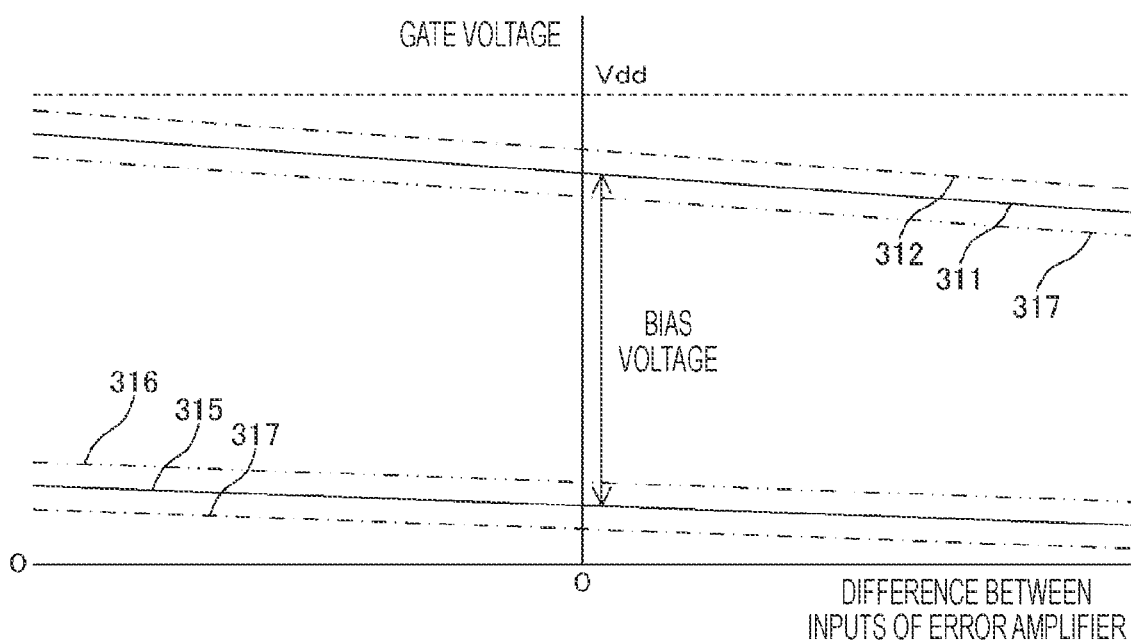
FIG. 13 is a diagram illustrating an example of adjustment of a control signal according to the fourth embodiment of the present disclosure.

FIG. 13 is a diagram illustrating an example of adjustment of the control signal according to the fourth embodiment of the present disclosure. The figure illustrates the adjustment of the control signal of the error amplifier 101 by the adjusting unit 170. In the figure, a continuous line graph 311 is a graph representing the relationship between the input difference of the error amplifier 101 and the gate voltage of the MOS transistor 111. Furthermore, a long dashed dotted line graph 312 is a graph when there are many adjustment signals in the adjusting unit 170, and a long dashed double-dotted line 317 is a graph when there are a few adjustment signals in the adjusting unit 170.

In the figure, a continuous line graph 315 is a graph representing the relationship between the input difference of the error amplifier 101 and the gate voltage of the MOS transistor 114. Furthermore, a long dashed dotted line graph 317 is a graph when there are many adjustment signals in the adjusting unit 170, and a long dashed double-dotted line 316 is a graph when there are a few adjustment signals in the adjusting unit 170. The "bias voltage" in the figure represents the bias voltage generated by the bias circuit 180.

As illustrated in the figure, the bias voltage of the bias circuit 180 changes according to the adjustment signal of the adjusting unit 170, and the increase and reduction of the source-side power supply current and the sink-side power supply current of the MOS transistors 111 and 114 are compensated.

The configuration of the duty ratio correction circuit 10 is similar to the configuration of the duty ratio correction circuit 10 described in the third embodiment of the present disclosure except for the part described above. Thus, the description thereof will not be provided.

As described above, the duty ratio correction circuit 10 of the fourth embodiment of the present disclosure controls the source-side power supply current and the sink-side power supply current of the inverting buffer 110 by the one error amplifier 101. Thus, the configuration of the duty ratio correction circuit 10 can be simplified.

5. Fifth Embodiment

The duty ratio correction circuit 10 of the third embodiment described above supplies the source-side power supply current and the sink-side power supply current to the inverting buffer 110 by the MOS transistors 111 and 114. On the other hand, a duty ratio correction circuit 10 of a fifth embodiment of the present disclosure applies a control signal to the gates of MOS transistors 112 and 113 included in an inverting buffer 110 to adjust the source-side power supply current and the sink-side power supply current, and is different from that of the above-described third embodiment in this point.

[Configuration of Duty Ratio Correction Circuit]

Figure 14:
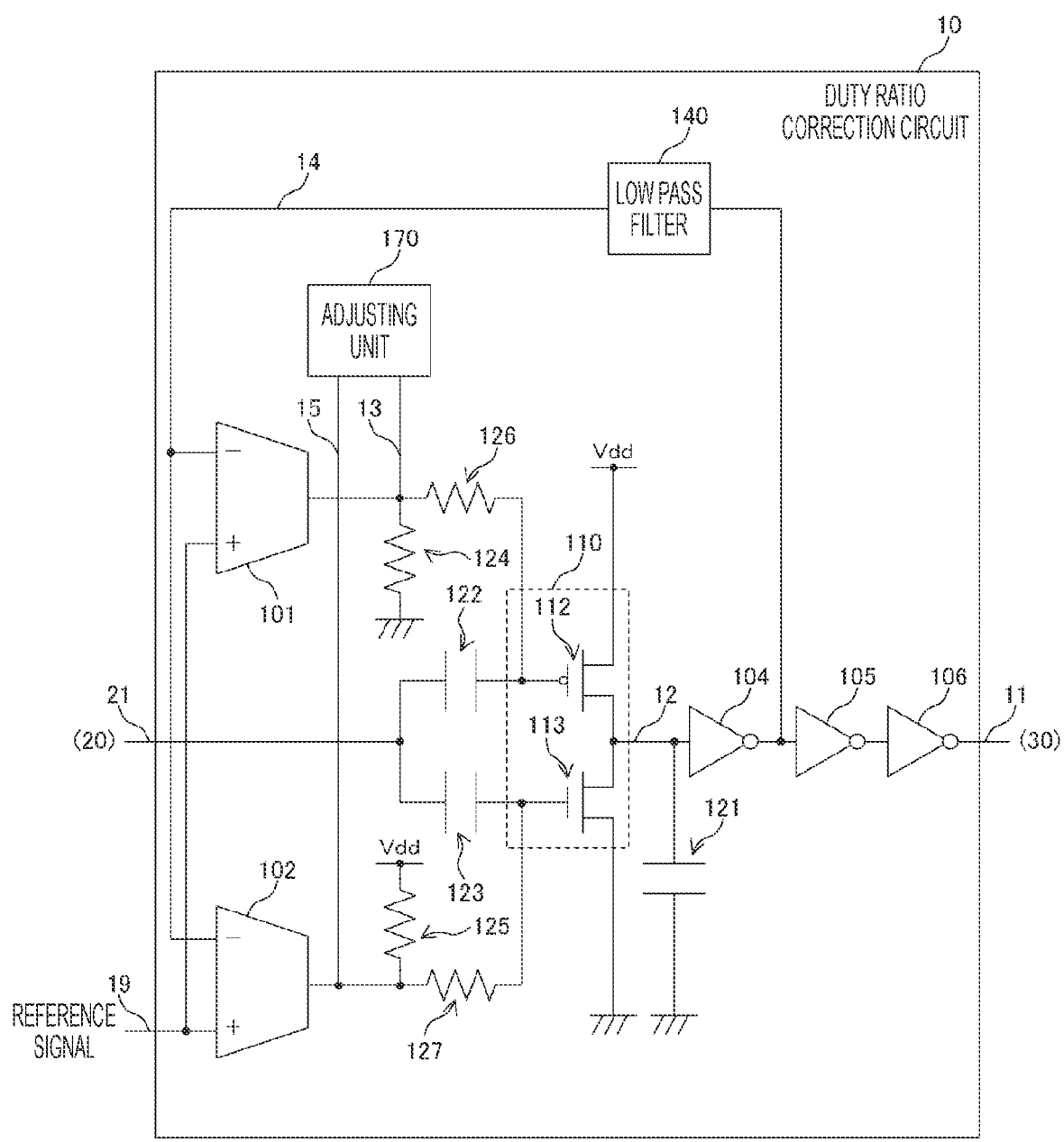
FIG. 14 is a diagram illustrating a configuration example of a duty ratio correction circuit according to a fifth embodiment of the present disclosure.

FIG. 14 is a diagram illustrating a configuration example of a duty ratio correction circuit according to the fifth embodiment of the present disclosure. The duty ratio correction circuit 10 of the figure does not have the MOS transistor 111 or the MOS transistor 114, but further includes resistors 126 and 127 and capacitors 122 and 123, and thus is different from the duty ratio correction circuit 10 described with reference to FIG. 8 in this point.

The capacitor 122 is connected between a signal line 21 and the gate of a MOS transistor 112, and the capacitor 123 is connected between a signal line 21 and the gate of a MOS transistor 113. The resistor 126 is connected between a signal line 13 and the gate of a MOS transistor 112, and the resistor 127 is connected between a signal line 15 and the gate of a MOS transistor 113. The source of the MOS transistor 112 is connected to the power supply line Vdd, and the source of the MOS transistor 113 is grounded. The wiring other than the part described above is similar to that of the duty ratio correction circuit 10 described with reference to FIG. 8, and thus the description thereof will not be provided.

To the gates of the MOS transistors 112 and 113, a clock signal from the signal line 21 is input via the capacitors 122 and 123, respectively. Furthermore, control signals of error amplifiers 101 and 102 are input to the gates of the MOS transistors 112 and 113 via the resistors 126 and 127, respectively. By these control signals, the gate bias voltages of the MOS transistors 112 and 113 are changed to adjust the source-side current of the MOS transistor 112 and the sink-side current of the MOS transistor 113.

The configuration of the duty ratio correction circuit 10 is similar to the configuration of the duty ratio correction circuit 10 described in the third embodiment of the present disclosure except for the part described above. Thus, the description thereof will not be provided.

As described above, the duty ratio correction circuit 10 of the fifth embodiment of the present disclosure applies an input clock signal to the gates of the MOS transistors included in the inverting buffer 110 by capacitor coupling, and also applies the control signal to the gates of the MOS transistors. Thus, the source constant current power supply unit and the sink constant current power supply unit are not needed, and the configuration of the duty ratio correction circuit 10 can be simplified.

Finally, the description of each embodiment described above is an example of the present disclosure, and the present disclosure is not limited to the above-described embodiments. Therefore, it is needless to say that in addition to the above-described embodiments, various modifications can be made according to the design and the like as long as the modifications do not deviate from the technical concept according to the present disclosure.

Note that the present technology may have the following configurations.

(1) A duty ratio correction circuit including:
an inverting buffer configured to invert a signal that is input;
a capacitor connected to an output of the inverting buffer to adjust rising time and falling time of the inverted signal;
a low pass filter configured to extract a low frequency component of the inverted signal;
an error amplifier configured to adjust a duty ratio of the inverted signal by controlling at least one of an output source current or an output sink current of the inverting buffer on the basis of a difference between the extracted low frequency component and a reference signal to change at least one of a rising edge or a falling edge of the inverted signal; and
an adjusting unit configured to adjust the control of the inverting buffer by the error amplifier.

(2) The duty ratio correction circuit according to the above-described (1) further including a constant current power supply unit configured to supply a power supply current to the inverting buffer, in which
the error amplifier adjusts the duty ratio of the inverted signal by outputting a control signal for controlling the power supply current of the constant current power supply unit to change at least one of the rising edge or the falling edge of the inverted signal, and
the adjusting unit adjusts the control of the inverting buffer by the error amplifier by adjusting the control signal that is output.

(3) The duty ratio correction circuit according to the above-described (2), in which the adjusting unit includes a current mirror circuit to which a power supply voltage is applied, and adjusts the output control signal by superimposing a mirror current of the current mirror circuit as an adjustment signal on the output control signal.

(4) The duty ratio correction circuit according to the above-described (2) or (3), in which the constant current power supply unit includes a source constant current power supply unit configured to supply a source-side power supply current to the inverting buffer and a sink constant current power supply unit configured to supply a sink-side power supply current to the inverting buffer.

(5) The duty ratio correction circuit according to the above-described (4), in which the error amplifier includes a source-side error amplifier configured to output a control signal to the source constant current power supply unit and a sink-side error amplifier configured to output a control signal to the sink constant current power supply unit.

(6) The duty ratio correction circuit according to the above-described (4) further including a bias circuit configured to apply a predetermined bias voltage to the control signal and supply the control signal to the source-side constant current power supply unit and the sink-side constant current power supply unit.

(7) The duty ratio correction circuit according to any one of the above-described (1) to (6) further including an offset adjusting unit configured to adjust an offset of the error amplifier.

(8) The duty ratio correction circuit according to any one of the above-described (1) to (7), in which the inverting buffer includes a p-channel MOS transistor and an n-channel MOS transistor having drain terminals that are commonly connected, and the drain terminals that are commonly connected work as an output terminal of the inverting buffer itself.

(9) The duty ratio correction circuit according to the above-described (8), in which the inverting buffer includes a capacitor connected between each of gates of the p-channel MOS transistor and the n-channel MOS transistor and an input terminal of the inverting buffer itself.

(10) A signal generation circuit including:
an oscillator circuit configured to generate a signal;
an inverting buffer configured to invert the signal;
a capacitor connected to an output of the inverting buffer to adjust rising time and falling time of the inverted signal;
a low pass filter configured to extract a low frequency component of the inverted signal;
an error amplifier configured to adjust a duty ratio of the inverted signal by controlling at least one of an output source current or an output sink current of the inverting buffer on the basis of a difference between the extracted low frequency component and a reference signal to change at least one of a rising edge or a falling edge of the inverted signal; and an adjusting unit configured to adjust the control of the inverting buffer by the error amplifier.

REFERENCE SIGNS LIST

10 Duty ratio correction circuit
20 PLL
30 Power Amplifier
40 Matching network
50 Transmitting antenna
101, 102, 161 Error amplifier
103, 180 Bias circuit
104 to 106, 110 Inverting buffer
107, 108 Voltage source
111 to 116, 151 to 154, 183 to 188 MOS transistor
121 to 123, 142, 165 Capacitor
124, 141, 155 Resistor
131, 132 Constant current circuit
140 Low pass filter
150, 170 Adjusting unit
160 Offset adjusting unit
162 to 164 Switch
181, 182 Current source

The invention claimed is:

1. A duty ratio correction circuit comprising:
an inverting buffer configured to invert a signal that is input;
a capacitor connected to an output of the inverting buffer to adjust rising time and falling time of the inverted signal;
a low pass filter configured to extract a low frequency component of the inverted signal;
an error amplifier including an output, the error amplifier being configured to adjust a duty ratio of the inverted signal by controlling at least one of an output source current or an output sink current of the inverting buffer on a basis of a difference between the extracted low frequency component and a reference signal to change at least one of a rising edge or a falling edge of the inverted signal; and
an adjusting unit connected to the output of the error amplifier and configured to adjust the control of the inverting buffer by the error amplifier.

2. The duty ratio correction circuit according to claim 1, further comprising:
a constant current power supply unit configured to supply a power supply current to the inverting buffer, wherein
the error amplifier adjusts the duty ratio of the inverted signal by outputting a control signal for controlling the power supply current of the constant current power supply unit to change at least one of the rising edge or the falling edge of the inverted signal, and
the adjusting unit adjusts the control of the inverting buffer by the error amplifier by adjusting the control signal that is output.

3. The duty ratio correction circuit according to claim 2, wherein the adjusting unit includes a current mirror circuit to which a power supply voltage is applied, and adjusts the output control signal by superimposing a mirror current of the current mirror circuit as an adjustment signal on the output control signal.

4. The duty ratio correction circuit according to claim 2, wherein the constant current power supply unit includes a source constant current power supply unit configured to supply a source-side power supply current to the inverting buffer and a sink constant current power supply unit configured to supply a sink-side power supply current to the inverting buffer.

5. The duty ratio correction circuit according to claim 4, wherein the error amplifier includes a source-side error amplifier configured to output a control signal to the source constant current power supply unit and a sink-side error amplifier configured to output a control signal to the sink constant current power supply unit.

6. The duty ratio correction circuit according to claim 4 further comprising a bias circuit configured to apply a predetermined bias voltage to the control signal and supply the control signal to the source-side constant current power supply unit and the sink-side constant current power supply unit.

7. The duty ratio correction circuit according to claim 1 further comprising an offset adjusting unit configured to adjust an offset of the error amplifier.

8. The duty ratio correction circuit according to claim 1, wherein the inverting buffer includes a p-channel MOS transistor and an n-channel MOS transistor having drain terminals that are commonly connected, and the drain terminals that are commonly connected work as an output terminal of the inverting buffer itself.

9. The duty ratio correction circuit according to claim 8, wherein the inverting buffer includes a capacitor connected between each of gates of the p-channel MOS transistor and the n-channel MOS transistor and an input terminal of the inverting buffer itself.

10. A signal generation circuit comprising:
an oscillator circuit configured to generate a signal;
an inverting buffer configured to invert the signal;
a capacitor connected to an output of the inverting buffer to adjust rising time and falling time of the inverted signal;
a low pass filter configured to extract a low frequency component of the inverted signal;
an error amplifier including an output, the error amplifier being configured to adjust a duty ratio of the inverted signal by controlling at least one of an output source current or an output sink current of the inverting buffer on a basis of a difference between the extracted low frequency component and a reference signal to change at least one of a rising edge or a falling edge of the inverted signal; and
an adjusting unit connected to the output of the error amplifier and configured to adjust the control of the inverting buffer by the error amplifier.

11. The signal generation circuit according to claim 10, further comprising:
a constant current power supply unit configured to supply a power supply current to the inverting buffer, wherein
the error amplifier adjusts the duty ratio of the inverted signal by outputting a control signal for controlling the power supply current of the constant current power supply unit to change at least one of the rising edge or the falling edge of the inverted signal, and
the adjusting unit adjusts the control of the inverting buffer by the error amplifier by adjusting the control signal that is output.

12. The signal generation circuit according to claim 11, wherein the adjusting unit includes a current mirror circuit to which a power supply voltage is applied, and adjusts the output control signal by superimposing a mirror current of the current mirror circuit as an adjustment signal on the output control signal.

13. The signal generation circuit according to claim 11, wherein the constant current power supply unit includes a source constant current power supply unit configured to supply a source-side power supply current to the inverting buffer and a sink constant current power supply unit configured to supply a sink-side power supply current to the inverting buffer.

14. The signal generation circuit according to claim 13, wherein the error amplifier includes a source-side error amplifier configured to output a control signal to the source constant current power supply unit and a sink-side error amplifier configured to output a control signal to the sink constant current power supply unit.

15. The signal generation circuit according to claim 13 further comprising a bias circuit configured to apply a predetermined bias voltage to the control signal and supply the control signal to the source-side constant current power supply unit and the sink-side constant current power supply unit.

16. The signal generation circuit according to claim 10 further comprising an offset adjusting unit configured to adjust an offset of the error amplifier.

17. The signal generation circuit according to claim 10, wherein the inverting buffer includes a p-channel MOS transistor and an n-channel MOS transistor having drain terminals that are commonly connected, and the drain terminals that are commonly connected work as an output terminal of the inverting buffer itself.

18. The signal generation circuit according to claim 17, wherein the inverting buffer includes a capacitor connected between each of gates of the p-channel MOS transistor and the n-channel MOS transistor and an input terminal of the inverting buffer itself.

* * * * *